United States Patent
Tanigaki et al.

(10) Patent No.: US 12,406,825 B2
(45) Date of Patent: Sep. 2, 2025

(54) INTERFERENCE SCANNING TRANSMISSION ELECTRON MICROSCOPE

(71) Applicant: Hitachi, Ltd., Tokyo (JP)

(72) Inventors: Toshiaki Tanigaki, Tokyo (JP); Fumiaki Ichihashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 431 days.

(21) Appl. No.: 17/991,415

(22) Filed: Nov. 21, 2022

(65) Prior Publication Data
US 2023/0207258 A1 Jun. 29, 2023

(30) Foreign Application Priority Data
Dec. 24, 2021 (JP) .................. 2021-211017

(51) Int. Cl.
- H01J 37/28 (2006.01)
- G01N 23/20091 (2018.01)
- H01J 37/22 (2006.01)

(52) U.S. Cl.
CPC ........ H01J 37/28 (2013.01); G01N 23/20091 (2013.01); H01J 37/226 (2013.01); *H01J 2237/2802* (2013.01)

(58) Field of Classification Search
CPC .. H01J 37/28; H01J 37/226; H01J 2237/2802; H01J 2237/2594; H01J 2237/2614; H01J 2237/2803; H01J 2237/2809; G01N 23/20091; G01N 23/04
See application file for complete search history.

(56) References Cited

U.S. PATENT DOCUMENTS

| | | | | |
|---|---|---|---|---|
| 4,936,665 A * | 6/1990 | Whitney | ............ | G02B 27/0075 359/741 |
| 4,998,788 A * | 3/1991 | Osakabe | ................. | H01J 37/29 250/311 |
| 5,192,867 A * | 3/1993 | Osakabe | ................. | H01J 37/29 250/311 |
| 6,933,501 B2 * | 8/2005 | Kaji | ........................ | H01J 37/28 250/311 |
| 7,227,144 B2 * | 6/2007 | Tsuneta | ............... | H01J 37/2955 250/311 |

(Continued)

FOREIGN PATENT DOCUMENTS

JP 2021-064446 A 4/2021

OTHER PUBLICATIONS

Japanese Office Action issued on Jan. 7, 2025 for Japanese Patent Application No. 2021-211017.

*Primary Examiner* — David A Vanore
(74) *Attorney, Agent, or Firm* — Volpe Koenig

(57) ABSTRACT

An interference scanning transmission electron microscope includes an electron source configured to emit an electron beam, a lens configured to irradiate a sample with a converged electron beam, an electron beam bi-prism configured to divide an electron wave through the sample and to superimpose a first electron wave and a second electron wave divided to form an interference fringe, a camera which is a detector configured to detect the interference fringe, and a computer configured to calculate a phase difference between the first electron wave and the second electron wave based on the interference fringe, wherein the electron beam bi-prism is provided between the sample and the detector.

6 Claims, 7 Drawing Sheets

(56) References Cited

U.S. PATENT DOCUMENTS

| | | | | |
|---|---|---|---|---|
| 7,755,046 | B2* | 7/2010 | Kohashi | H01J 37/266 250/311 |
| 9,312,098 | B2* | 4/2016 | Lazic | H01J 37/244 |
| 10,714,308 | B2* | 7/2020 | Kohno | H01J 37/28 |
| 2003/0066964 | A1* | 4/2003 | Nagayama | H01J 37/26 250/311 |
| 2003/0085350 | A1* | 5/2003 | Kaji | G01N 23/04 250/311 |
| 2004/0144923 | A1* | 7/2004 | Tanji | H01J 37/22 250/311 |
| 2008/0290290 | A1* | 11/2008 | Nagakubo | H01J 37/20 250/443.1 |
| 2009/0045339 | A1* | 2/2009 | Harada | H01J 37/023 250/311 |
| 2009/0078868 | A1* | 3/2009 | de Jonge | H01J 37/26 250/310 |
| 2011/0031395 | A1* | 2/2011 | Harada | H01J 37/295 250/311 |
| 2013/0193343 | A1* | 8/2013 | Nagakubo | H01J 37/20 250/441.11 |
| 2013/0284925 | A1* | 10/2013 | Tanigaki | H01J 37/22 250/311 |
| 2013/0313432 | A1* | 11/2013 | Tanigaki | H01J 37/295 250/311 |
| 2014/0197312 | A1* | 7/2014 | Harada | H01J 37/243 250/311 |
| 2014/0353500 | A1* | 12/2014 | Tsuneta | H01J 37/26 250/311 |
| 2016/0047760 | A1* | 2/2016 | Ujihara | H02S 50/15 250/305 |
| 2017/0281102 | A1* | 10/2017 | Ken | G01N 37/005 |
| 2019/0027338 | A1* | 1/2019 | Sugawara | H01J 37/244 |
| 2019/0079033 | A1* | 3/2019 | Ujihara | H01J 49/46 |
| 2019/0196070 | A1* | 6/2019 | Harada | H01J 37/26 |
| 2019/0295816 | A1* | 9/2019 | Iwasaki | H01J 37/26 |
| 2020/0105498 | A1* | 4/2020 | Harada | H01J 37/295 |
| 2020/0273657 | A1* | 8/2020 | Tanigaki | H01J 37/295 |
| 2021/0110992 | A1* | 4/2021 | Takahashi | H01J 37/26 |
| 2021/0302333 | A1* | 9/2021 | Henstra | H01J 37/26 |
| 2023/0207258 | A1* | 6/2023 | Tanigaki | G01N 23/04 250/311 |
| 2024/0192152 | A1* | 6/2024 | Tanigaki | G01N 23/02 |

* cited by examiner

INTERFERENCE SCANNING TRANSMISSION ELECTRON MICROSCOPE

CROSS-REFERENCE TO RELATED APPLICATION

The present invention claims priority under 35 U.S.C. § 119 to Japanese Patent Application No. 2021-211017 filed on Dec. 24, 2021, the entire content of which is incorporated herein by reference.

BACKGROUND OF THE INVENTION

1. Field of the Invention

The present invention relates to a device using an electron beam, and more particularly, to a scanning transmission electron microscope configured to irradiate a sample with a focused electron beam and to scan the electron beam to obtain an image of the sample. Further, the present invention relates to a microscope apparatus configured to observe electromagnetic field information of a sample by detecting a transmitted electron beam and analyzing the same.

2. Description of the Related Art

An electron microscope is a device capable of observing and analyzing a structure of a substance at an atomic resolution level, and is used in various fields from physical property research to a biological field. In particular, in order to perform atomic level observation, provided is a scanning transmission electron microscope in which an electron beam having a short wavelength is used by accelerating electrons at an acceleration voltage of 100 kV or more, the electron beam is narrowly focused on a sample, and transmitted electrons are detected while scanning the electron beam, thereby obtaining an image of the sample. With the recent practical application of an aberration corrector, atomic resolution can be obtained even at an acceleration voltage of about 30 kV in an aberration-corrected electron microscope, and an acceleration voltage of a microscope can be selected according to the purpose of observation.

An observation method that has attracted attention in recent years with this scanning transmission electron microscope is a differential phase contrast method (refer to U.S. Pat. Nos. 9,312,098 and 10,714,308).

SUMMARY OF THE INVENTION

In the differential phase contrast method which is the above-described existing method, there is a problem in that sensitivity capable of detecting a differential phase difference deteriorates when spatial resolution is increased.

An object of the present invention is to provide an interference scanning transmission electron microscope capable of detecting a high differential phase difference even in high-resolution observation when an electromagnetic field of a sample is observed with a scanning transmission electron microscope.

In order to achieve the above object, the present invention provides an interference scanning transmission electron microscope including: an electron source configured to emit an electron beam, a lens configured to irradiate a sample with a converged electron beam, a bi-prism configured to divide an electron wave transmitted through the sample and to superimpose a first electron wave and a second electron wave divided to form an interference fringe, a detector configured to detect the interference fringe, and a computer configured to calculate a phase difference between the first electron wave and the second electron wave based on the interference fringe, wherein the bi-prism is provided between the sample and the detector.

According to the present invention, a differential phase difference can be analyzed with high sensitivity by analyzing an entire interference pattern, and a high differential phase difference can be detected even under the conditions of high-resolution observation. Other objects, configurations and advantages of the invention will become apparent from the following description of embodiments.

DESCRIPTION OF THE PREFERRED EMBODIMENTS

Figure 1:
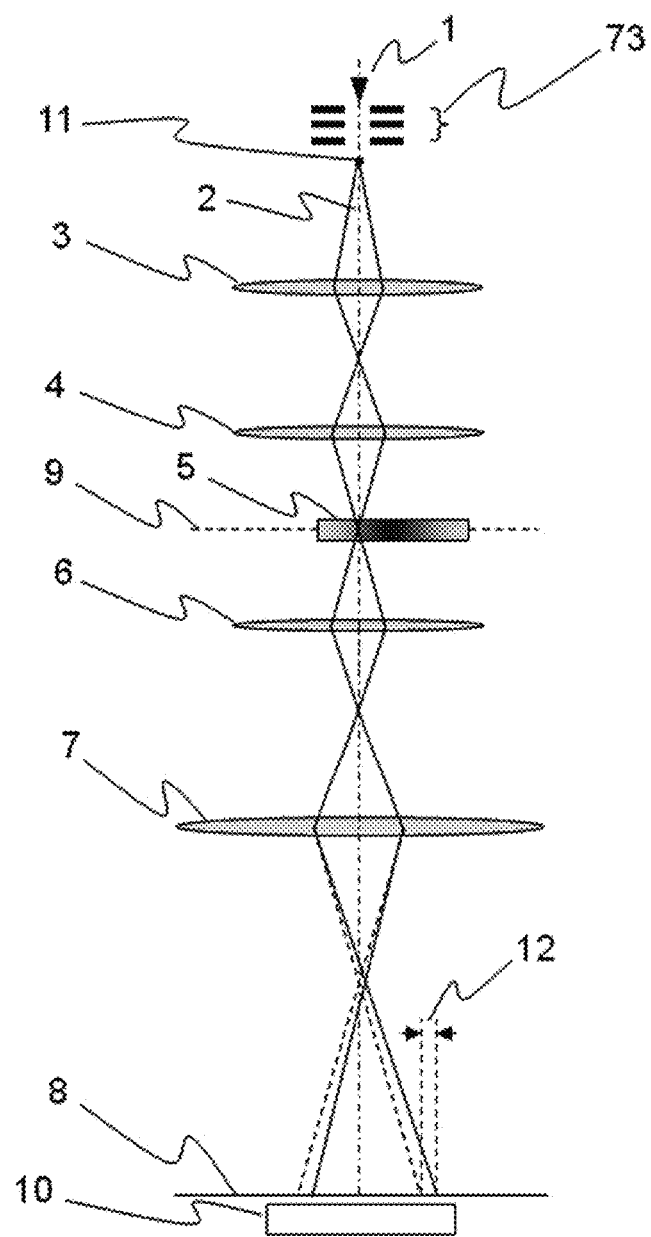
FIG. 1 is a schematic diagram of an example of a differential phase difference scanning transmission electron microscope apparatus of a conventional method.

Hereinafter, embodiments of the present invention will be described with reference to the drawings. However, the present invention is not to be construed as being limited to the description of a plurality of embodiments described below. It goes without saying that the specific configuration can be changed without departing from the spirit or gist of the present invention. In the configuration of the present invention described below, the same reference numerals are commonly used for the same portions or portions having similar functions in different drawings, and redundant description may be omitted.

First, problems of a conventional method will be described with reference to FIGS. 1 to 3.

FIG. 1 shows a schematic diagram of differential phase contrast (DPC) scanning transmission electron microscopy. An electron wave 2 emitted from an electron source 1 travels as illustrated in the drawing. A convergence angle of an electron beam is adjusted by an irradiation electron lens 3 and an objective lens 4, a sample 5 is placed between the objective lens 4 and a first magnifying lens 6, and the sample 5 is irradiated with the converged electron beam. The electron beam transmitted through the sample is magnified by the action of the first magnifying lens 6 and a second magnifying lens 7, and the magnified electron beam is detected by a camera 10 on an observation surface 8.

Figure 2A:
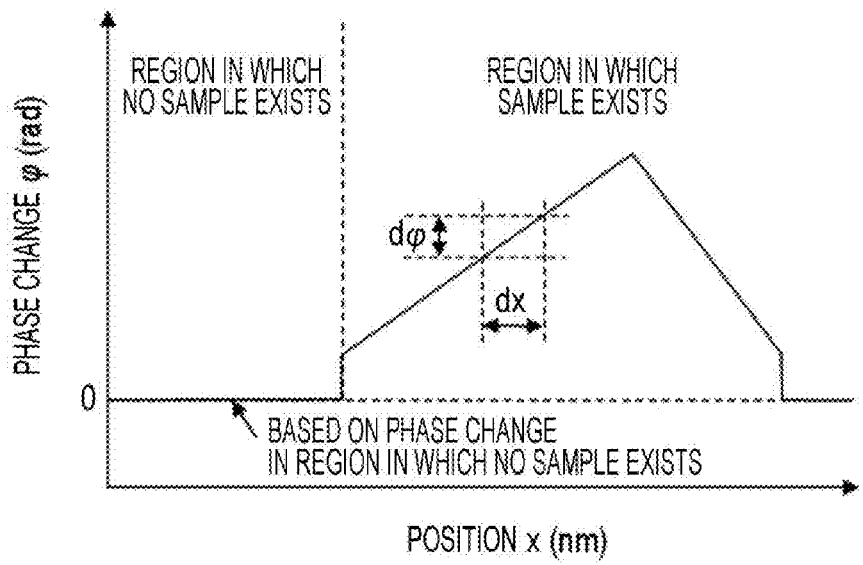
FIG. 2A is a schematic diagram illustrating a phase change of an electron beam by a sample and FIG. 2B is a schematic diagram illustrating a differential phase difference of an electron beam by a sample.
Figure 2B:
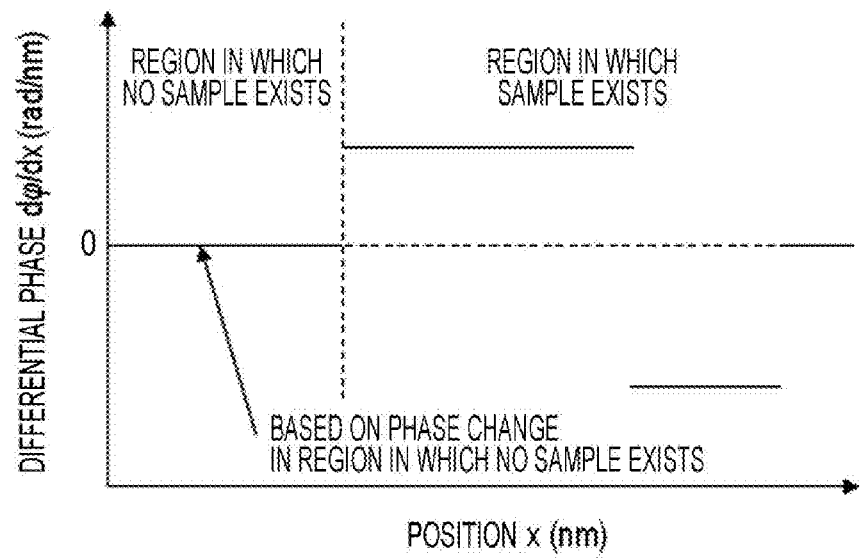

When an electromagnetic field exists in the sample, as illustrated in FIG. 2A, a phase change φ (rad) of the electron beam occurs at each position. As a simple description, in consideration of a sample having a phase change only in the x-direction of the horizontal axis, when the differential phase of dφ/dx (rad/nm) is illustrated with respect to the position x on the horizontal axis, the differential phase is as shown in FIG. 2B. For example, when a sample of a magnetic thin film (a thickness of the thin film sample is 50 nm) having a saturation magnetization of 2T is observed, a phase gradient of 0.152 rad/nm occurs. This phase gradient can be associated with a deflection angle θ of the electron beam affected by the sample by the following equation (1).

$$\theta = d\varphi \lambda 2\pi / dx \quad (1)$$

Here, λ is a wavelength of an electron beam.

Figure 3:
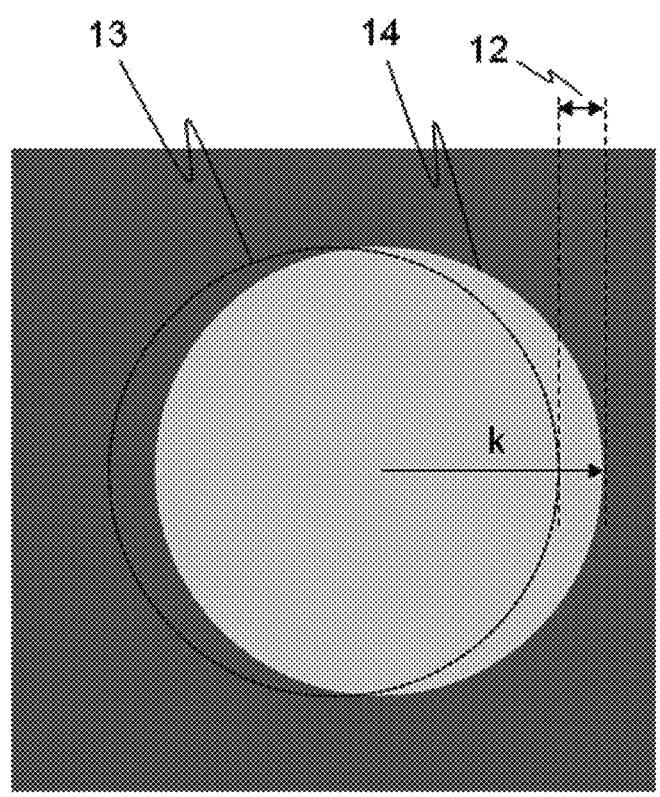
FIG. 3 is a schematic diagram illustrating a position of an electron beam in a detector.

FIG. 3 illustrates a position of an electron beam on a detector. When it can be assumed that no electromagnetic field exists in a sample and no phase differentiation occurs therein, electrons are detected at an electron detection position 13 at which there is no differential phase difference. When there is a differential phase difference due to the influence of an electromagnetic field by a sample, electrons are detected at an electron detection position 14 at which there is a differential phase difference. At this time, a change in the position at which the electrons are detected due to the differential phase difference becomes a position change 12 of the electron beam. The disk-shaped detection position of the electron beam in FIG. 3 corresponds to a convergence angle of the electron beam converged on the sample and emitted thereto, and the convergence angle defines the outermost angle of the electron beam from the optical axis as α [semi-angle of beam convergence]. A relationship between the convergence angle α and the disk in the detector is a linear relationship and is represented by the following equation (2).

$$\alpha = k\lambda \quad (2)$$

Here, k is a radius of the electron beam disk on the detector. Further, spatial resolution R in a method of the present invention is represented by the following equation (3).

$$R = 0.61 \lambda / \alpha \quad (3)$$

As can be seen from equation (3), it is necessary to increase the convergence angle α in order to increase the spatial resolution. Meanwhile, since the electron beam detector has a finite size, projection is performed at an optimum magnification using the first magnifying lens 6 and the second magnifying lens 7 disposed between the sample 5 and the observation surface 8 so that the entire electron beam disk is detected by the detector.

That is, in the detector, the size of the electron beam disk can be adjusted independently of the convergence angle α of the electron beam with which the sample is irradiated. At this time, the sensitivity σk of the position change of the electron beam that can be detected is different depending on the number of electron beams N used for detection, and is represented by the following equation (4) using the radius k of the electron beam disk on the detector.

$$\sigma k = k/2\sqrt{N} \quad (4)$$

The deflection sensitivity σa of the electron beam is represented by the following equation (5).

$$\sigma\alpha = \alpha/2\sqrt{N} \quad (5)$$

To summarize the above relationship, when the convergence angle α is increased in order to increase the spatial resolution, the electron beam disk of FIG. 3 becomes large, and as such, it becomes difficult to detect the position change of the electron beam and the electron beam deflection due to the electromagnetic field of the sample with high sensitivity. As described above, the spatial resolution and the differential phase difference are in a trade-off relationship, and it is a problem in the conventional method that the differential phase difference cannot be detected with high sensitivity in high-resolution observation. This problem is solved by an interference scanning transmission electron microscope of each embodiment described below.

First Embodiment

The first embodiment is an example of an interference scanning transmission electron microscope having a configuration including an electron source configured to emit an electron beam, a lens configured to irradiate a sample with a converged electron beam, a bi-prism configured to divide an electron wave transmitted through the sample and to superimpose a first electron wave and a second electron wave divided to form an interference fringe, a detector configured to detect the interference fringe, and a computer configured to calculate a phase difference between the first electron wave and the second electron wave based on the interference fringe, wherein the bi-prism is provided between the sample and the detector.

According to the present embodiment, it is possible to analyze a differential phase difference of a sample by converging an electron beam on the sample to irradiate and scan the sample, detecting the electron beam transmitted through the sample by interfering an electron wave by the action of an electron beam bi-prism installed between the sample and an electron beam detector, and analyzing an interference pattern thereof.

Figure 4:
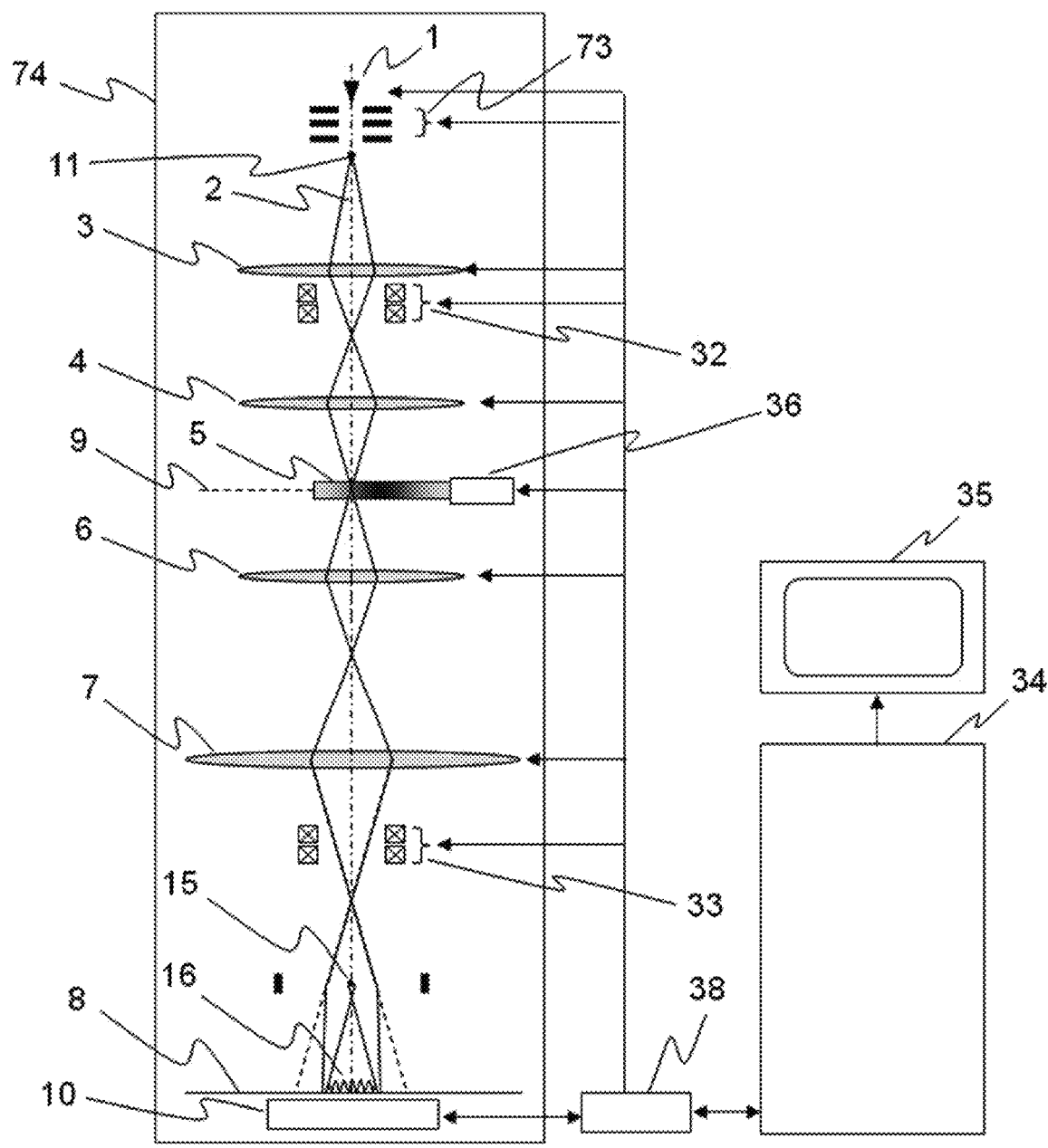
FIG. 4 is a schematic diagram illustrating an interference scanning transmission electron microscope according to a first embodiment.

The interference scanning transmission electron microscope according to the first embodiment will be described with reference to FIG. 4. FIG. 4 shows a configuration of an electron microscope of the first embodiment in differential phase difference measurement using the scanning transmission electron microscope. Note that the principle configuration described below can be similarly applied to an electron microscope of another embodiment.

In FIG. 4, the electron source 1 is located at the most upstream portion in the direction in which an electron wave flows, a voltage is applied to a first extraction electrode, a second extraction electrode, and an acceleration electrode, and the electron wave emitted from the electron source 1 is accelerated and converged on a first electron source 11. In this specification, the first extraction electrode, the second extraction electrode, and the acceleration electrode are collectively defined as an acceleration tube 73. By controlling the voltage applied thereto, a wavelength of an electron beam is changed, and as such, the trajectory thereof is also changed. Therefore, the first electron source 11 on electron optics is illustrated again in the drawing.

In this configuration, although a diaphragm is not illustrated between the acceleration tube 73 and the sample 5 in FIG. 4, the use of the diaphragm to adjust a region in which the sample 5 is irradiated with the electron wave is not different from that of a general microscope, and thus illustration is omitted here. Although only one irradiation electron lens 3 is illustrated, adjustment of electron beam irradiation conditions to the sample by using two or more irradiation electron lenses is not different from that of a general microscope, and thus illustration is omitted here.

The electron beam is converged by the action of the objective lens 4, and the sample is irradiated with the converged electron beam. The scanning of the electron beam in the in-plane direction at the sample position is performed by a scanning coil 32 which is a first deflector. In addition, the electron beam transmitted through the sample 5 is magnified or condensed by the actions of the first magnifying lens 6 and the second magnifying lens 7, the electron beams of one side and the other side of the electron transmitted through the sample are superimposed on the observation surface 8 by an electron beam bi-prism 15 installed between the sample and the observation surface 8, an interference pattern of the electron beam is generated on the observation surface 8, and the generated interference pattern is detected by the camera 10 installed on the observation surface 8.

Figure 5:
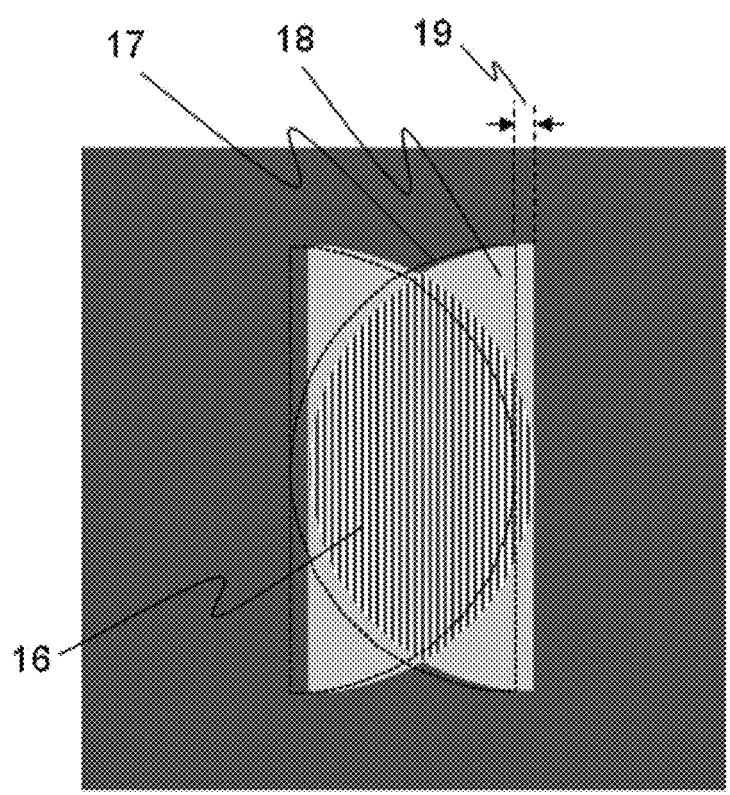
FIG. 5 is a schematic diagram illustrating a state of an interference pattern in the detector according to the first embodiment.

FIG. 5 illustrates an interference pattern in the camera 10 which is a detector. The electron beam is divided by the electron beam bi-prism disposed at the center of an electron beam disk, and the respective electron beams are superimposed by the detector by the action of the electron beam bi-prism, and an interference pattern 16 is obtained. In the method of the present invention as well, the deflection of the electron beam in the sample is detected as a change in the position of the electron beam in the detector, and a position change between an interference electron detection position 17 at which there is no differential phase difference and an interference electron detection position 18 at which there is a differential phase difference is recorded by the camera 10 as a position change 19 of the interference electron beam.

The recorded interference pattern 16 can analyze a phase difference between the right and left sides of the electron beam transmitted through the sample by the Fourier transform method generally used when phase reproduction is performed in electron beam holography. At this time, when a measured phase difference $d\varphi$ is defined as a difference $dx$ between the center positions of the right and left menisci of the electron transmitted through the sample, the differential phase difference is represented by $d\varphi/dx$. Since the differential phase difference can be analyzed using the entire interference pattern 16, the differential phase difference can be measured with high sensitivity as compared with the conventional method in which the differential phase difference is analyzed from the position change 12 of the electron beam illustrated in FIG. 3 of the conventional method.

Figure 6:
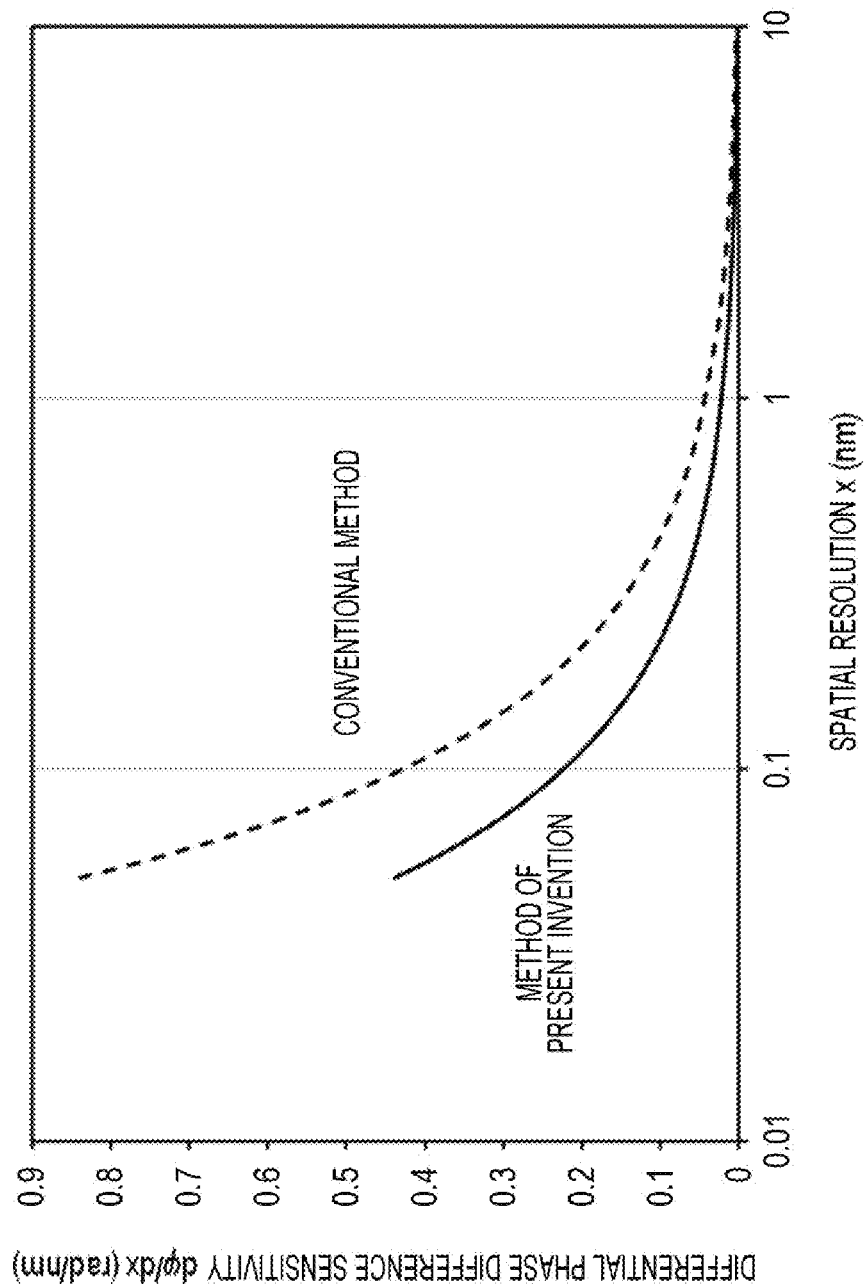
FIG. 6 is a diagram illustrating a relationship between differential phase difference sensitivity and spatial resolution in the conventional method and the present invention.

FIG. 6 is a diagram illustrating a relationship between differential phase difference sensitivity and spatial resolution in the conventional method and the present invention obtained by simulation. Conditions of the simulation are an acceleration voltage of 200 kV, an electron beam wavelength of 0.00251 nm, and an electron beam detection amount N=2,000 in each pixel of two-dimensional scanning. Here, the convergence angle $\alpha$ of the electron beam is varied, and the spatial resolution in the horizontal axis is calculated from the convergence angle $\alpha$ of the electron beam using equation (3). As illustrated in FIG. 6, as compared with the conventional method, the method of the present invention can provide high differential phase difference sensitivity in high-resolution observation as well.

Since the electron beam is scanned at the sample position, the differential phase difference at each position of the sample is measured. By combining the measured differential phase difference with scanning position information at the sample position of the electron beam, a two-dimensional image of a differential phase image can be obtained.

Next, an important function of implementing high-sensitivity measurement will be described. In order to scan the electron beam on the sample surface, the scanning coil 32 is used to scan the electron beam. In this case, it is necessary to adjust the position of the electron beam in the electron beam bi-prism 15 so as not to be changed when there is no differential phase difference in the sample. If this adjustment is not implemented, the position at which the electron beam passes through the bi-prism is changed by the action of the scanning coil, and as such, a differential phase difference image of an artifact that is not originally present in the sample is generated.

Therefore, by interlocking the operation of a swing back coil (a de-scanning coil) 33, which is a second deflector, with the scanning coil 32, a state in which the position of the electron beam at the position of the electron beam bi-prism 15 does not change is realized even if the electron beam is scanned on the sample surface using the scanning coil 32. Specifically, in the state in which there is no sample, the scanning coil 32 is moved by a certain amount, and the current flowing through the swing back coil 33 in which the position of the electron beam in the electron beam bi-prism 15 at that time does not change is calibrated. As a result, a ratio of a control current amount between the scanning coil 32 and the swing back coil 33 for appropriate swing back can be determined, and the scanning coil 32 and the swing back coil 33 are interlocked according to the determined ratio of the control current amount to scan the electron beam, thereby making it possible to achieve the above object.

In the electron microscope of FIG. 4, the voltage applied to each of the electron source 1 and the acceleration tube 73, the excitation state of a sample micromotion mechanism 36 and the electron lens, the control of the current flowing through the scanning coil 32 and the swing back coil 33, and the measurement of the interference pattern by the camera 10 are controlled by a control system 38 connected to a control personal computer (PC) 34. The control system 38 calculates and controls a current value flowing through the swing back coil 33, which is a parameter, based on a current value flowing through the scanning coil 32, which is a parameter.

In an actual electron microscope, provided are a deflection system configured to change a traveling direction of an electron beam, a diaphragm mechanism configured to limit a region through which the electron beam passes, and the like in addition to those illustrated in this schematic diagram, and these elements are also controlled by the control system 38 connected to the control PC 34. However, since these devices are not directly related to the electron microscope disclosed in this specification, these devices are omitted in this drawing.

Note that the control PC 34 has a normal computer configuration including a central processing unit (CPU) which is a processing unit, a memory which is a storage unit, an input/output interface unit, and the like, which are interconnected. In this specification, the PC 34 and the control system 38 configured to control a device may be collectively referred to as a control unit of the device. As illustrated in this schematic diagram, an electron optical element is assembled in an electron microscope main body 74 which is a vacuum container, and is continuously evacuated by a vacuum pump. A vacuum system other than the vicinity of a sample chamber is not directly related to the electron microscope of the present invention, and thus illustration and description thereof are omitted.

According to the aspect of the interference scanning transmission electron microscope of the present embodiment outlined above, high differential phase difference sensitivity can be obtained in high-resolution observation when the differential phase difference is observed. As a result, for example, it is expected to develop application to direct observation of a potential distribution derived from a bond between atoms with atomic level resolution and a magnetic moment with atomic resolution. These atomic level electromagnetic field measurements are expected to contribute to innovation of materials such as various energy conversion materials, a fuel cell, a Li-ion cell, and an artificial photosynthesis catalyst for realizing carbon neutral, which have attracted great attention these days, and elucidation of degradation mechanisms for optimization of these controls.

Second Embodiment

Figure 7:
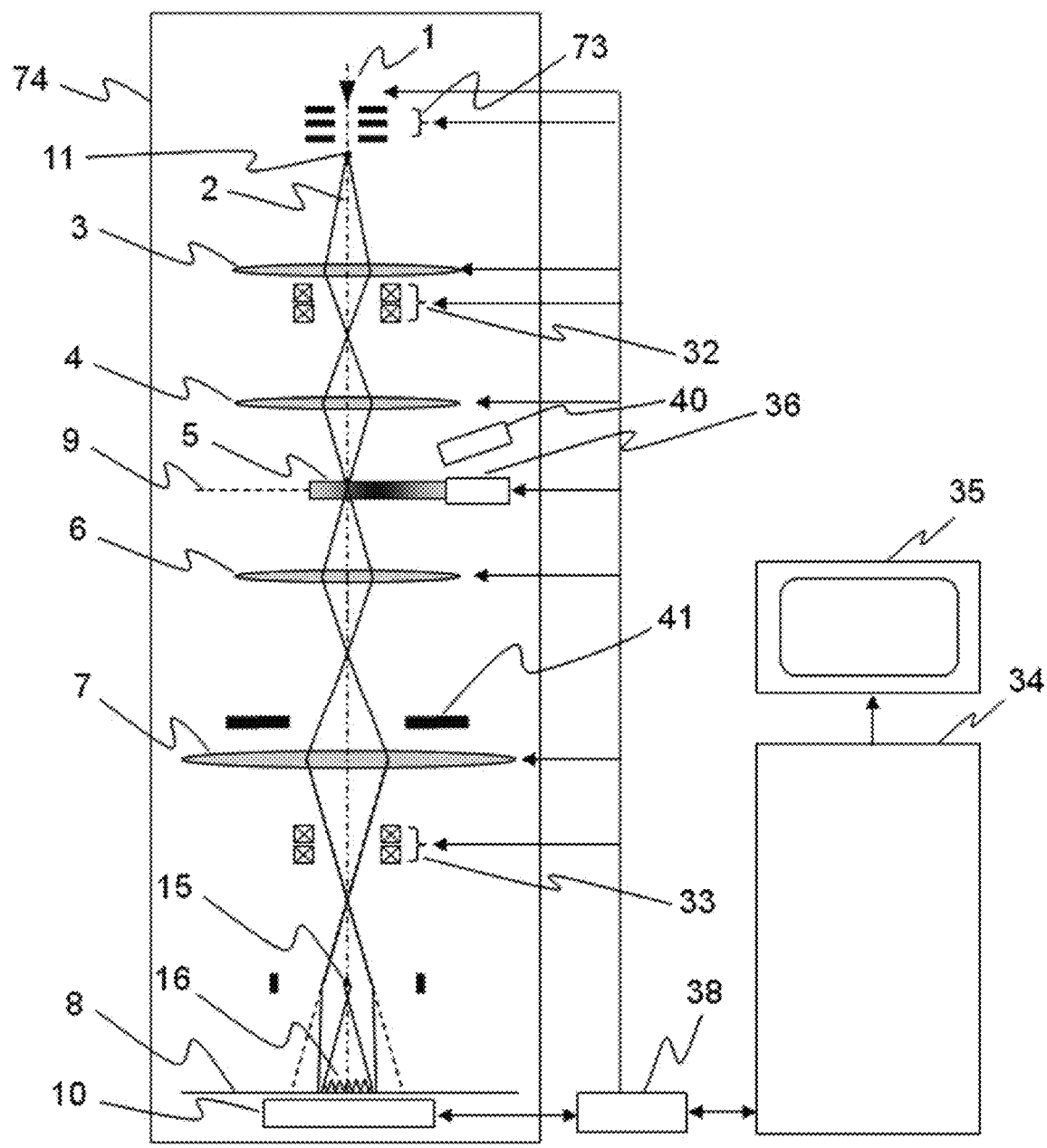
FIG. 7 is a schematic diagram illustrating an interference scanning transmission electron microscope combined with an analytical instrument according to a second embodiment.

FIG. 7 is a schematic diagram illustrating an interference scanning transmission electron microscope according to a second embodiment. Since a configuration of the present embodiment is similar to that of the first embodiment, description of the same portion as that of the first embodiment will be omitted, and a difference in device configuration therebetween will be described.

The present embodiment is an interference scanning transmission electron microscope combined with various kinds of measurement and element analysis by utilizing the characteristics of irradiating a sample with a converged electron beam. By detecting high-angle scattered electrons of the electron beam with which the sample is irradiated by an annular detector 41, it becomes possible to easily observe the distribution of a light element and a heavy element. In addition, an energy dispersive X-ray spectrometer 40 is provided, thereby making it possible to perform elemental analysis of the sample. In addition, a measurement combined with an optical characteristic using a cathodoluminescence detector (not illustrated) is also analogized. The simultaneous acquisition of these various analysis results and the phase differential image is very useful for more detailed understanding of the sample.

The essence of the present embodiment is to combine an interference scanning transmission electron microscope and other analytical instruments, and is not limited to the configuration illustrated in FIG. 7.

The present invention is not limited to the above-described embodiments, and includes various modifications. For example, the above-described embodiments have been described in detail for better understanding of the present invention, and are not necessarily limited to those having all the configurations of the description.

The interference scanning transmission electron microscope of the present invention described above is put into practical use as high-sensitivity differential phase difference observation in high-resolution observation, and an electromagnetic field at an atomic level can be observed with higher sensitivity by implementing the present invention with a novel device. For example, the mechanism of the catalyst is clarified by the observation function newly realized by the new device using the present invention, and it is expected to contribute to the development of a fuel cell and a $CO_2$ fuel catalyst having high performance and high durability, which are required to realize a carbon neutral society required worldwide in the future.

What is claimed is:

1. An interference scanning transmission electron microscope for detecting differential phase contrast (DPC) with higher sensitivity, the interference scanning transmission electron microscope comprising:
    an electron source configured to emit an electron beam;
    a lens configured to irradiate a sample with a converged electron beam;
    a bi-prism configured to divide an electron wave transmitted through the sample into a first electron wave and a second electron wave;
    a detector configured to detect an interference fringe, wherein the interference fringe is a result of a superposition of the first electron wave and the second electron wave;
    a first deflector configured to scan the electron beam across the sample;
    a second deflector configured to offset beam movement caused by the first deflector such that a beam position at the bi-prism remains constant during scanning
    a processor communicatively coupled to the detector, wherein the processor is configured to:
        interlock control of the first and second deflectors to maintain beam alignment at the bi-prism,
        receive the interference fringe from the detector,
        calculate a phase difference between the first electron wave and the second electron wave based on inference patterns in the interference fringe, and
        detect the DPC based on the phase difference.

2. The interference scanning transmission electron microscope according to claim 1, wherein the processor further:
    generates a phase image or a differential phase difference image based on the DPC.

3. The interference scanning transmission electron microscope according to claim 1, wherein the processor is further configured to:
    calculate a current value, which is a parameter of the second deflector, based on a current value, which is a parameter of the first deflector.

4. The interference scanning transmission electron microscope according to claim 1, wherein the first deflector is a scanning coil and the second deflector is a swing back coil.

5. The interference scanning transmission electron microscope according to claim 1, further comprising an annular detector.

6. The interference scanning transmission electron microscope according to claim 1, further comprising an energy dispersive X-ray spectrometer.

* * * * *